US012674819B2

(12) United States Patent
Chen et al.

(10) Patent No.: US 12,674,819 B2
(45) Date of Patent: Jul. 7, 2026

(54) PROBE PIN CLEANING PAD AND CLEANING METHOD FOR PROBE PIN

(71) Applicant: Alliance Material Co., Ltd., Hsinchu County (TW)

(72) Inventors: Chun-Fa Chen, Hsinchu County (TW); Yu-Hsuen Lee, Hsinchu County (TW); Ching-Wen Hsu, Hsinchu County (TW); Chao-Hsuan Yang, Hsinchu County (TW); Ting-Wei Lin, Hsinchu County (TW)

(73) Assignee: Alliance Material Co., Ltd., Hsinchu County (TW)

( * ) Notice: Subject to any disclaimer, the term of this patent is extended or adjusted under 35 U.S.C. 154(b) by 299 days.

(21) Appl. No.: 18/506,139

(22) Filed: Nov. 10, 2023

(65) Prior Publication Data

US 2024/0069069 A1 Feb. 29, 2024

Related U.S. Application Data

(63) Continuation-in-part of application No. 17/691,129, filed on Mar. 10, 2022, now Pat. No. 11,865,588.
(Continued)

(30) Foreign Application Priority Data

| Mar. 2, 2020 | (TW) | ................................. | 109106766 |
| Oct. 22, 2020 | (TW) | ................................. | 109136656 |
| Sep. 23, 2023 | (TW) | ................................. | 112136486 |

(51) Int. Cl.
| *G01R 3/00* | (2006.01) |
| *B08B 1/10* | (2024.01) |
(Continued)

(52) U.S. Cl.
CPC .................. *G01R 3/00* (2013.01); *B08B 1/10* (2024.01); *B32B 5/18* (2013.01); *B32B 7/022* (2019.01);
(Continued)

(58) Field of Classification Search
CPC .... G01R 3/00; B08B 1/10; B08B 1/00; B32B 5/18; B32B 7/022; B32B 7/12; B32B 27/065; B32B 27/18; B32B 27/283; B32B 2250/03; B32B 2264/02; B32B 2266/0214; B32B 2266/08; B32B 2307/54; B32B 2307/72; B32B 2307/7376; B32B 2307/748; B32B 2432/00; B32B 3/04; B32B 2264/102; B32B 2307/536; B24D 13/147; B24D 11/00; B24B 19/16
See application file for complete search history.

(56) References Cited

U.S. PATENT DOCUMENTS

| 5,212,910 | A | * | 5/1993 | Breivogel | ............... | B24B 37/26 451/527 |
| 6,217,426 | B1 | * | 4/2001 | Tolles | .................... | B24B 37/26 451/526 |
(Continued)

*Primary Examiner* — Paresh Patel
(74) *Attorney, Agent, or Firm* — JCIPRNET

(57) ABSTRACT

A probe pin cleaning pad including a foam layer, a cleaning layer, and a polishing layer is provided. The cleaning layer is disposed between the foam layer and the polishing layer. A cleaning method for a probe pin is also provided.

8 Claims, 10 Drawing Sheets

100

200

Related U.S. Application Data which is a continuation-in-part of application No. 17/095,747, filed on Nov. 12, 2020, now abandoned.

(60) Provisional application No. 62/933,990, filed on Nov. 12, 2019.

(51) Int. Cl.

| | |
|---|---|
| *B32B 5/18* | (2006.01) |
| *B32B 7/022* | (2019.01) |
| *B32B 7/12* | (2006.01) |
| *B32B 27/06* | (2006.01) |
| *B32B 27/18* | (2006.01) |
| *B32B 27/28* | (2006.01) |

(52) U.S. Cl.
CPC .............. *B32B 7/12* (2013.01); *B32B 27/065* (2013.01); *B32B 27/18* (2013.01); *B32B 27/283* (2013.01); *B32B 2250/03* (2013.01); *B32B 2264/02* (2013.01); *B32B 2266/0214* (2013.01); *B32B 2266/08* (2013.01); *B32B 2307/54* (2013.01); *B32B 2307/72* (2013.01); *B32B 2307/7376* (2023.05); *B32B 2307/748* (2013.01); *B32B 2432/00* (2013.01)

(56) References Cited

U.S. PATENT DOCUMENTS

| | | | |
|---|---|---|---|
| 11,446,788 B2 * | 9/2022 | Bajaj ...................... | B24D 18/00 |
| 2007/0205753 A1 * | 9/2007 | Hau .......................... | G01R 3/00 |
| | | | 324/758.01 |
| 2012/0280706 A1 * | 11/2012 | Uenda .................... | B08B 1/143 |
| | | | 15/209.1 |

* cited by examiner

210

220

230

240

250

161

260

171

270

200

70      300

80

81

70      300

PROBE PIN CLEANING PAD AND CLEANING METHOD FOR PROBE PIN

CROSS-REFERENCE TO RELATED APPLICATION

This application is a continuation-in-part application of U.S. patent application Ser. No. 17/691,129, filed on Mar. 10, 2022, now allowed. The U.S. patent application Ser. No. 17/691,129 is a continuation-in-part application of U.S. patent application Ser. No. 17/095,747, filed on Nov. 12, 2020, now abandoned, which claims the priority benefits of U.S. provisional application Ser. No. 62/933,990, filed on Nov. 12, 2019, Taiwan application serial no. 109106766, filed on Mar. 2, 2020 and Taiwan application serial no. 109136656, filed on Oct. 22, 2020. This application also claims the priority benefit of Taiwan application serial no. 112136486, filed on Sep. 23, 2023. The entirety of each of the above-mentioned patent applications is hereby incorporated by reference herein and made a part of this specification.

BACKGROUND

Technical Field

The disclosure relates to a cleaning pad and a cleaning method for a probe pin, particularly to a probe pin cleaning pad and a cleaning method for a probe pin by using the probe pin cleaning pad.

Description of Related Art

In a test (for example but not limited to, final test (FT) or chip probing (CP)) of an electronic component, a probe pin is often employed for electrical measurement. Impurities or scratches, if any, present on the probe pin, may affect test results of the electronic component.

SUMMARY

The disclosure provides a probe pin cleaning pad and a cleaning method for a probe pin by using the probe pin cleaning pad, which are suitable for cleaning of probe pins.

A probe pin cleaning pad according to the disclosure includes a foam layer, a cleaning layer, and a polishing layer. The cleaning layer is disposed between the foam layer and the polishing layer.

A cleaning method for a probe pin according to the disclosure includes the following. In step 1, an electronic component is tested by the probe pin. In step 2, after step 1, the probe pin is cleaned by the probe pin cleaning pad of any one of the foregoing embodiments.

Based on the above, in the probe pin cleaning pad and the cleaning method for a probe pin by using the probe pin cleaning pad according to the disclosure, since the cleaning layer is adapted to adhere to and cover a substance on the probe pin, the probe pin cleaning pad and the cleaning method for a probe pin are suitable for cleaning of probe pins and may reduce scratches on the probe pins.

DESCRIPTION OF THE EMBODIMENTS

Figure 1A:
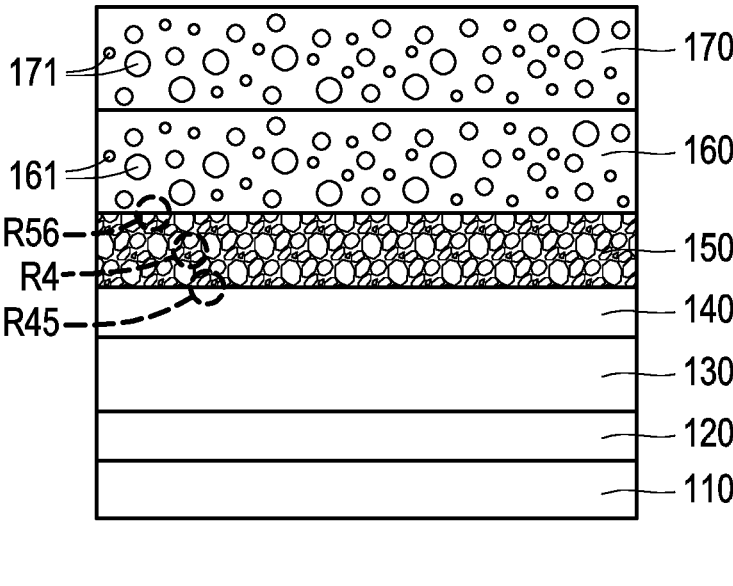
FIG. 1A is a schematic cross-sectional view of a probe pin cleaning pad according to a first embodiment of the disclosure.

In the drawings, sizes of elements or layers may be enlarged or reduced for clarity. In addition, some layers or components may be omitted from the drawings for clarity. Directional terms (for example, up, down, right, left, front, back, top, and bottom) as used herein are made only with reference to the figures as drawn and are not intended to imply absolute orientation.

A numerical value indicated in the specification may include the numerical value and a deviation value within a range acceptable to one of ordinary skill in the art. The above deviation value may be one or more standard deviations in a manufacturing or measurement process, or calculation error caused by factors such as the number of digits used in calculation or conversion, rounding, or error propagation.

FIG. 1A is a schematic cross-sectional view of a probe pin cleaning pad according to a first embodiment of the disclosure.

Referring to FIG. 1A, a probe pin cleaning pad 100 may include a release layer 110, a first adhesive layer 120, a substrate layer 130, a second adhesive layer 140, a foam layer 150, a cleaning layer 160, and a polishing layer 170. The release layer 110 and the substrate layer 130 may be respectively disposed on two opposite sides of the first adhesive layer 120. The substrate layer 130 and the foam layer 150 may be respectively disposed on two opposite sides of the second adhesive layer 140. The cleaning layer 160 may be disposed on the foam layer 150. The polishing layer 170 may be disposed on the cleaning layer 160.

In an embodiment, the foam layer 150, the cleaning layer 160 and the polishing layer 170 are disposed in a stacked manner. That is, the cleaning layer 160 is sandwiched between the foam layer 150 and the polishing layer 170, and/or the foam layer 150 and the polishing layer 170 are in contact with two opposite sides of the cleaning layer 160.

In an embodiment, the release layer 110, the first adhesive layer 120, the substrate layer 130, the second adhesive layer 140, the foam layer 150, the cleaning layer 160, and the polishing layer 170 are disposed in a stacked manner.

In an embodiment, the probe pin cleaning pad 100 may serve as a probe card cleaning pad. For example, the probe pin cleaning pad 100 is adapted for a probe pin to embed and penetrate a portion of the layers (e.g., to penetrate the polishing layer 170 and to embed the cleaning layer 160), wherein substances are attached to the probe pin before being cleaned. However, the disclosure is not limited thereto. An application of the probe pin cleaning pad 100 may refer to the subsequent FIGS. 4A-4F and/or FIGS. 5A-5D and the description corresponding thereto.

[The Release Layer]

In an embodiment, the release layer 110 includes a release film or release paper. However, the disclosure is not limited thereto. In an embodiment, a material of the release film serving as the release layer 110 includes polyethylene terephthalate (PET). In an embodiment, the release film has a thickness of 25 micrometers (μm) to 175 μm. However, the disclosure is not limited thereto. In an embodiment, the release film has a release force of 2 gf/25 mm to 200 gf/25 mm. However, the disclosure is not limited thereto.

[The First Adhesive Layer]

In an embodiment, an appropriate material (e.g., a resin) is directly covered on a surface of a corresponding layer (e.g., the release layer 110 or the substrate layer 130 mentioned later) by an appropriate process (e.g., a coating process) to form a corresponding adhesive layer (e.g., the first adhesive layer 120).

In an embodiment, the first adhesive layer 120 has a thickness of greater than or substantially equal to 10 μm and less than or substantially equal to 50 μm. For example, the first adhesive layer 120 substantially has a thickness of 25 μm.

If a first adhesive layer (e.g., same or similar material and/or structure as the first adhesive layer 120, but with a different thickness) has a thickness of less than 10 μm, adhesion force of the aforementioned first adhesive layer may be reduced.

If a first adhesive layer (e.g., same or similar material and/or structure as the first adhesive layer 120, but with a different thickness) has a thickness of greater than 50 μm, the overall thickness of the probe pin cleaning pad (including the aforementioned first adhesive layer having a thickness of greater than 50 μm) may be increased due to the excessive thickness of the aforementioned first adhesive layer, thus increasing the material cost or affecting the use of the other layers.

When using the probe cleaning pad 100, the release layer 110 may be peeled off first, and then the exposed first adhesive layer 120 may be attached to a corresponding object.

[The Substrate Layer]

In an embodiment, a material of the substrate layer 130 may include polyethylene terephthalate (PET), polyimide (PI), polyether ether ketone (PEEK), polyethylenimine (PEI), polyamide (PA), polyethersulfone (PES), polyethylene naphthalate (PEN), or a stack of the foregoing or a combination thereof.

In an embodiment, the substrate layer 130 has a thickness of greater than or substantially equal to 12 μm and less than or substantially equal to 200 μm. For example, the substrate layer 130 substantially has a thickness of 100 μm to 125 μm.

If a substrate layer (e.g., same or similar material and/or structure as the substrate layer 130, but with a different thickness) has a thickness of less than 12 μm, insufficient support is provided.

If a substrate layer (e.g., same or similar material and/or structure as the substrate layer 130, but with a different thickness) has a thickness of greater than 200 μm, the overall thickness of the probe pin cleaning pad (including the substrate layer having a thickness of greater than 200 μm) may be increased, thus increasing the material cost or affecting the other layers.

[The Second Adhesive Layer]

In an embodiment, an appropriate material (e.g., a resin) is directly covered on a surface of a corresponding layer (e.g., the substrate layer 130 or the foam layer 150 mentioned later) by an appropriate process (e.g., a coating process) to form a corresponding adhesive layer (e.g., the second adhesive layer 140).

In an embodiment, the second adhesive layer 140 is referred as a pressure sensitive adhesive (PSA) layer.

In an embodiment, a material of the second adhesive layer 140 includes acrylic resin, silicone resin, a stack of the above, or a combination of the above. The adhesive force of the second adhesive layer 140 is greater than or substantially equal to 400 gf/25 mm. If an adhesive force of a second adhesive layer (e.g., same or similar structure as the second adhesive layer 140, but with a different adhesive force) is too small (e.g., less than 400 gf/25 mm), it may easily separate from the corresponding object. In an embodiment, the adhesive force of the second adhesive layer 140 is 400 gf/25 mm to 1,600 gf/25 mm substantially.

In an embodiment, the second adhesive layer 140 has a thickness of greater than or substantially equal to 10 μm and less than or substantially equal to 300 μm. For example, the second adhesive layer 140 substantially has a thickness of 55 μm.

If a second adhesive layer (e.g., same or similar material and/or structure as the second adhesive layer 140, but with a different thickness) has a thickness of less than 10 μm, adhesion force of the aforementioned second adhesive layer may be reduced.

If a second adhesive layer (e.g., same or similar material and/or structure as the second adhesive layer 140, but with a different thickness) has a thickness of greater than 300 μm, the overall thickness of the probe pin cleaning pad (including the aforementioned second adhesive layer having a thickness of greater than 50 μm) may be increased due to the excessive thickness of the aforementioned second adhesive layer, thus increasing the material cost or affecting the use of the other layers.

In an embodiment, a Shore Hardness A of the second adhesive layer 140 is 40 A to 80 A substantially.

If a second adhesive layer (e.g., same or similar structure as the second adhesive layer 140, but with a different hardness) has a softer hardness (e.g., a Shore Hardness A is lower than 40 A), it is easy to overflow or squeeze out during production or use.

If a second adhesive layer (e.g., same or similar structure as the second adhesive layer 140, but with a different hardness) has a harder hardness (e.g., a Shore Hardness A is higher than 80 A), the compressibility may be relatively low, and/or it may be stiffer thereby reducing the filling ability.

[The Foam Layer]

In an embodiment, a material of the foam layer 150 may include polyethylene (PE) foam, polyurethane (PU) foam, polypropylene (PP) foam, polymethyl methacrylate (PMMA) foam, polyphenylsulfone (PPSF or PPSU) foam, silicone foam, a stack of the above or a combination of the above.

Figure 3A:
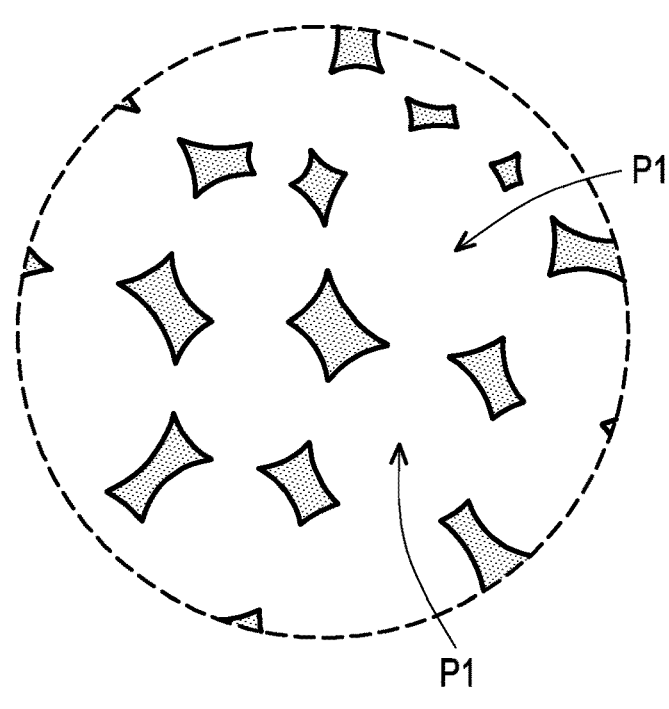
FIG. 3A is a schematic cross-sectional view of a foam layer with an open-cell structure.
Figure 3B:
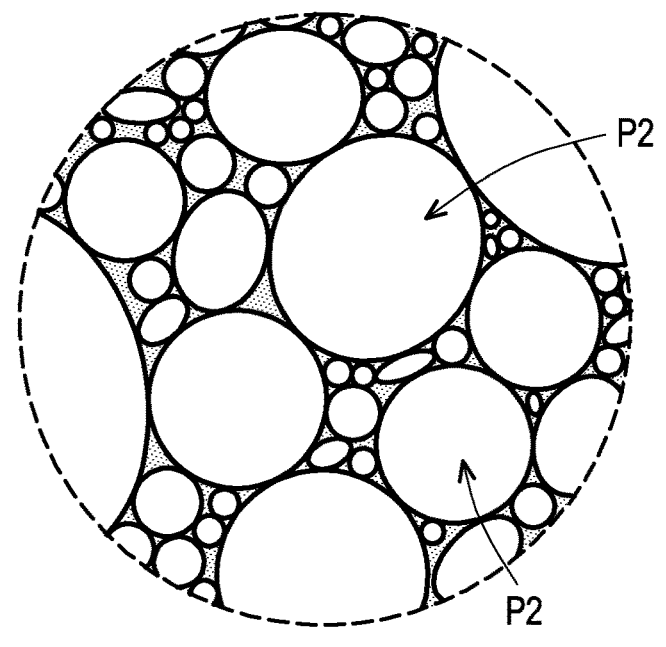
FIG. 3B is a schematic cross-sectional view of a foam layer with a closed-cell structure.

FIG. 3A is a schematic cross-sectional view of a foam layer with an open-cell structure. FIG. 3B is a schematic cross-sectional view of a foam layer with a closed-cell structure. A foam layer may have a corresponding open-cell structure or a corresponding closed-cell structure depending on the viscosity or cohesion of the initial polymer, the dosage or ratio of the foaming agent, the temperature, pressure, and/or reaction time during the formation process thereof. As shown in FIG. 3A, the holes P1 in an open-cell structure may be connected. As shown in FIG. 3B, the holes P2 in a closed-cell structure may be separated or not connected. In addition, for clarity or simplicity, not all holes are labelled in FIGS. 3A and 3B.

In an embodiment, the foam layer 150 has a closed-cell structure substantially. That is, FIG. 3B may be an enlarge view corresponding to the region R4 as shown in FIG. 1A. Compared with a foam layer with an open-cell structure, holes P1 of the foam layer 150 with a closed-cell structure is not connected to each other and is filled with air substantially. The foam layer 150 with a closed-cell structure has better cushioning capacity and/or be better able to absorb impact force. As such, the foam layer 150 with a closed-cell structure has higher structural strength, better waterproofness and/or better airtightness.

In an embodiment, the density of the foam layer 150 is 0.1 g/cm³ to 0.6 g/cm³ substantially.

If a foam layer (e.g., same or similar structure as the foam layer 150, but with a different density) has a lower density (e.g., lower than 0.1 g/cm³), the total volume of the holes of the aforementioned foam layer with a lower density will be correspondingly higher substantially. Although the afore-mentioned foam layer with a lower density may have a higher compression ratio in application, a larger force may be applied to the foam layer in order to effectively bond, thereby the difficulty of manufacturing or application may be increased.

If a foam layer (e.g., same or similar structure as the foam layer 150, but with a different density) has a higher density (e.g., higher than 0.6 g/cm³), the total volume of the holes of the aforementioned foam layer with a higher density will be correspondingly lower substantially. The aforementioned foam layer with a higher density may have a poor gap-filling or step-filling in application.

In an embodiment, the foam layer 150 has a thickness of greater than or substantially equal to 200 μm and less than or substantially equal to 1 millimeter (mm). For example, the foam layer 150 substantially has a thickness of 400 μm.

If a foam layer (e.g., same or similar material and/or structure as the foam layer 150, but with a different thickness) has a thickness of less than 200 μm, a cushioning capacity of the aforementioned foam layer may be poor.

If a foam layer (e.g., same or similar material and/or structure as the foam layer 150, but with a different thickness) has a thickness of greater than 1 mm, the overall thickness of the probe pin cleaning pad (including the aforementioned foam layer having a thickness of greater than 1 mm) may be increased due to the excessive thickness of the aforementioned foam layer, thus increasing the material cost or affecting the use of the other layers.

In an embodiment, the foam layer 150 is directly formed on the substrate layer 130 by an appropriate process (e.g., a coating process; and then, a foaming and curing process). That is, the second adhesive layer 140 is optional.

In an embodiment, the foam layer 150 is pre-formed and then indirectly disposed on the base material layer 130 by an appropriate process (such as pasting through the second adhesive layer 140).

For example, the second adhesive layer 140 is formed on the substrate layer 130, and then a corresponding foam layer 150 is attached to the second adhesive layer 140 disposed on the substrate layer 130.

For example, the second adhesive layer 140 is formed on the foam layer 150, and then a corresponding substrate layer 130 is attached to the second adhesive layer 140 disposed on the foam layer 150.

Figure 1B:
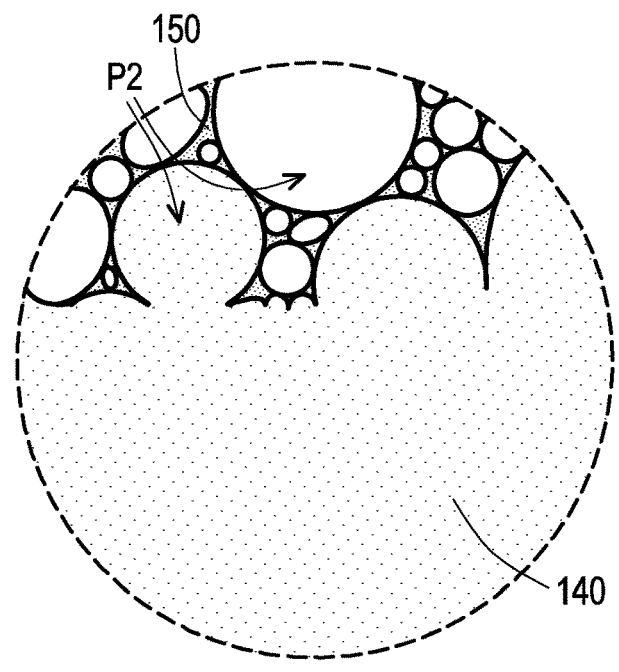
FIG. 1B is a schematic cross-sectional view of a probe pin cleaning pad according to an embodiment of the disclosure.

FIG. 1B is a schematic cross-sectional view of a probe pin cleaning pad according to a first embodiment of the disclosure. For example, FIG. 1B may be an enlarge view corresponding to the region R45 as shown in FIG. 1A. A liquid, paste or gel material (e.g., the raw material used to form the second adhesive layer 140) coated on the foam layer 150 may flow into the corresponding holes P2 on a surface of the foam layer 150. In this way, a bonding or attached surface between the second adhesive layer 140 and the foam layer 150 may be increased. Additionally, a portion of the second adhesive layer 140 may be embedded in the hole P2 of the foam layer 150 to form a corresponding embedded structure (e.g., the structure as shown in FIG. 1B). The aforementioned embedded structure may make it more difficult for the second adhesive layer 140 and the foam layer 150 to be separated from each other.

[The Cleaning Layer]

In an embodiment, the material of the cleaning layer 160 may include a plurality of organic particles 161 and a silicone resin wrapped therein. In addition, for clarity, not all organic particles 161 are labelled in the corresponding figures (e.g., FIG. 1A or 2). Moreover, sizes of the organic particles 161 may be enlarged clarity in a corresponding drawing (e.g., FIG. 1A or 2).

The aforementioned organic particles 161 include spherical or polygonal particles formed by an organic compound having an alkenyl group, an ether group, an amide group, an amine group, a carboxyl group, an ester group, an alcohol group, a silyl group, an alkoxy group, an alkoxysilyl group or a combination thereof. The particle size of the aforementioned organic particles is about 0.05 μm~30 μm.

The aforementioned silicon resin is, for example, an organic polymer formed by organosiloxane with a high cross-linked network structure. The aforementioned organosiloxane may include polydimethylsiloxane, polymethylphenylsiloxane, methylpolysilxane or a combination thereof. The glass-transition temperature (Tg) of the aforementioned silicon resin is lower than room temperature, for example, about –60° C.~–20° C. The weight average molecular weight of the aforementioned silicone resin is, for example, about 20,000 g/mol to 200,000 g/mol.

The cleaning layer 160 may be formed as follows. The chlorine group of the chlorosilane (e.g., methyltrichlorosilane, dimethyldichlorosilane, phenyltrichlorosilane, diphenyldichlorosilane, methylphenyldichlorosilane or a combination thereof) is replaced by a hydroxyl group by a hydrolysis reaction (may be referred as hydrolysis reaction) to produce the corresponding acidic hydrolyzate. The initial product (e.g., the aforementioned acidic hydrolysate) of the hydrolysis reaction may be a mixture of cyclic, linear and cross-linked polymers containing hydroxyl groups. The acidic hydrolysate could be washed with water to substantially remove the acid, resulting in a substantially neutral (e.g., pH=7±1) primary polycondensate. The aforementioned polycondensate is thermally oxidized in air or/and further polycondensed by a catalyst (may be referred as a dehydration polymerization reaction), then, a silicon resin with a high cross-linked network structure is formed by a dehydration polymerization reaction. The morphology of the silicone resin with high cross-linked network structure may be similar to a colloid, a gel or a paste. Then, a given organic particle 161 may be added to the silicone resin with high cross-linked network structure. By an accompanying stirring step during the mixing process, the distribution of the organic particles 161 in the silicone resin with high cross-linked network structure may be more uniform. There is substantially no chemical reaction between the silicone resin with high cross-linked network structure and the aforementioned organic particles. That is, the aforementioned organic particles 161 are not catalysts during the dehydration polymerization reaction or any reaction for forming the silicone resin. In other words, under the same or similar reaction conditions (e.g., at the same or similar reaction temperature), regardless of whether the aforementioned organic particles are added, the rate constant of the reaction for forming the silicone resin are substantially the same.

In an embodiment, the cleaning layer 160 has a Mohs hardness of less than 7. If a cleaning layer (e.g., same or similar thickness as the cleaning layer 160, but with a different hardness) has a Mohs hardness of greater than 7, scratches may be caused on the object (for example, the probe pin 91 in FIG. 4C, FIG. 4F, FIG. 5A to FIG. 5D) to be cleaned.

In an embodiment, the cleaning layer 160 has a Young's modulus of less than or substantially equal to 100 kg/cm². If a cleaning layer (e.g., same or similar thickness as the cleaning layer 160, but with a different modulus of elasticity in tension or compression) has a Young's modulus of greater than 100 kg/cm², when the object to be cleaned (for example, the probe pin 91 in FIG. 4C, FIG. 4F, FIG. 5A to FIG. 5D) and the probe pin cleaning pad 100 contact each other, the cleaning ability of the cleaning layer may be reduced.

In an embodiment, the cleaning layer 160 has a Young's modulus of greater than or substantially equal to 30 kg/cm². If a cleaning layer (e.g., same or similar thickness as the cleaning layer 160, but with a different modulus of elasticity in tension or compression) has a Young's modulus of less than 30 kg/cm², the cleaning ability of the cleaning layer may be reduced.

In an embodiment, the cleaning layer 160 may have a Young's modulus of greater than or substantially equal to 30 kg/cm² and less than or substantially equal to 100 kg/cm².

In an embodiment, the cleaning layer 160 may further have a Young's modulus of less than or substantially equal to 70 kg/cm². In an embodiment, the cleaning layer 160 may have a Young's modulus of greater than or substantially equal to 30 kg/cm² and less than or substantially equal to 70 kg/cm².

In an embodiment, the cleaning layer 160 may further have a Young's modulus of greater than or substantially equal to 50 kg/cm². In an embodiment, the cleaning layer 160 may have a Young's modulus of greater than or substantially equal to 50 kg/cm² and less than or substantially equal to 100 kg/cm².

In an embodiment, the cleaning layer 160 may further have a Young's modulus of greater than or substantially equal to 50 kg/cm² and less than or substantially equal to 70 kg/cm². When the object to be cleaned (for example, the probe pin 91 in FIG. 4C, FIG. 4F, FIG. 5A to FIG. 5D) and the probe pin cleaning pad 100 contact each other, the cleaning ability and the number of uses of the cleaning layer 160 may further be improved.

In an embodiment, the cleaning layer 160 may have a Mohs hardness of less than 7, and may have a Young's modulus of less than or substantially equal to 100 kg/cm², or further less than or substantially equal to 70 kg/cm².

In an embodiment, the cleaning layer 160 may have a Mohs hardness of less than 7, and may have a Young's modulus of greater than or substantially equal to 30 kg/cm², or further greater than or substantially equal to 50 kg/cm².

In an embodiment, the cleaning layer 160 has a Mohs hardness of less than 7. Moreover, the cleaning layer 160 may have a Young's modulus of greater than or substantially equal to 30 kg/cm² and less than or substantially equal to 100 kg/cm².

8

In an embodiment, the cleaning layer 160 has a Mohs hardness of less than 7. Moreover, the cleaning layer 160 may have a Young's modulus of greater than or substantially equal to 30 kg/cm² and less than or substantially equal to 70 kg/cm².

In an embodiment, the cleaning layer 160 has a Mohs hardness of less than 7. Moreover, the cleaning layer 160 may have a Young's modulus of greater than or substantially equal to 50 kg/cm² and less than or substantially equal to 100 kg/cm².

In an embodiment, the cleaning layer 160 has a Mohs hardness of less than 7. Moreover, the cleaning layer 160 may have a Young's modulus of greater than or substantially equal to 70 kg/cm² and less than or substantially equal to 70 kg/cm². When the object to be cleaned (for example, the probe pin 91 in FIG. 4C, FIG. 4F, FIG. 5A to FIG. 5D) and the probe pin cleaning pad 100 contact each other, the cleaning ability and the number of uses of the cleaning layer 160 may further be improved, and the risk of wear (for example, the occurrence of scratches) of the object to be cleaned (for example, the probe pin 91 in FIG. 4C, FIG. 4F, FIG. 5A to FIG. 5D) may be reduced.

In an embodiment, the organic particles may be adapted to be adhered or bonded to a metal material (for example, solder) and/or a metal oxide material.

In an embodiment, the organic particles 161 may further be adapted to be adhered or bonded (e.g., Van der Waals bonding) to the cross-linked network structure of the silicon resin. For example, in the organic compound used to form the organic powder particles 161, a functional group (e.g., an alkenyl group, an ether group, an amide group, an amine group, a carboxyl group, an ester group, an alcohol group, a silyl group, an alkoxy group, or an alkoxysilyl group) thereof may be suitable for adhering or bonding the cross-linked network structure of the silicon resin.

In an embodiment, the organic particles 161 may include spherical or polygonal poly(methyl methacrylate) (PMMA) particles with a surface treatment, spherical or polygonal polystyrene (PS) particles with a surface treatment, spherical or polygonal polysiloxane particles with a surface treatment or a combination thereof. The aforementioned treatment may include: perform an appropriate reaction to substitute a hydrogen on the surface of the polymer particle (e.g., PMMA particle, PS particle, or polysiloxane particle) with a functional group (e.g., an alkenyl group, an ether group, an amide group, an amine group, a carboxyl group, an ester group, an alcohol group, a silyl group, an alkoxy group, or an alkoxysilyl group) by an appropriate reaction.

In an embodiment, the organic particles 161 have a Mohs hardness of less than 7. If organic particles (e.g., same or similar size as the organic particles 161, but with a different hardness) have a Mohs hardness of greater than 7, scratches may be caused on the object to be cleaned (for example, the probe pin 91 in FIG. 4C, FIG. 4F, FIG. 5A to FIG. 5D).

In an embodiment, the material of the cleaning layer 160 may include no inorganic material.

In an embodiment, the cleaning layer 160 has a thickness of greater than or substantially equal to 150 μm and less than or substantially equal to 500 μm. If a cleaning layer (e.g., same or similar material as the cleaning layer 160, but with a different thickness) has a thickness of less than 150 μm, the cleaning ability of the probe pin cleaning pad 100 may be reduced. If a cleaning layer (e.g., same or similar material as the cleaning layer 160, but with a different thickness) has a thickness of greater than 500 μm, the risk of peeling of the cleaning layer 160 itself may be increased.

In an embodiment, the cleaning layer 160 has a thickness of greater than or substantially equal to 230 μm and less than or substantially equal to 300 μm. For example, In an embodiment, the cleaning layer 160 may substantially have a thickness of 265 μm.

Figure 1C:
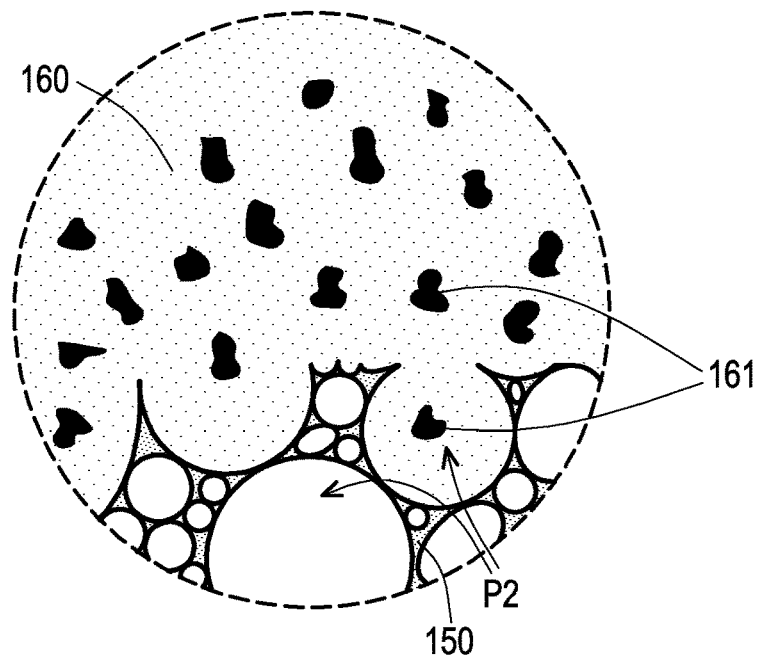
FIG. 1C is a schematic cross-sectional view of a probe pin cleaning pad according to an embodiment of the disclosure.

FIG. 1C is a schematic cross-sectional view of a probe pin cleaning pad according to a first embodiment of the disclosure. For example, FIG. 1C may be an enlarge view corresponding to the region R56 as shown in FIG. 1A. A liquid, paste or gel material (e.g., the raw material used to form the cleaning layer 160) coated on the foam layer 150 may flow into the corresponding holes P2 on a surface of the foam layer 150. In this way, a bonding or attached surface between the cleaning layer 160 and the foam layer 150 may be increased. Additionally, a portion of the cleaning layer 160 may be embedded in the hole P2 of the foam layer 150 to form a corresponding embedded structure (e.g., the structure as shown in FIG. 1C). The aforementioned embedded structure may make it more difficult for the cleaning layer 160 and the foam layer 150 to be separated from each other. Moreover, some organic particles 161 may be disposed within the hole P2 of the foam layer 150.

[The Polishing Layer]

In an embodiment, the material of the polishing layer 170 may include a plurality of inorganic particles 171 and a resin wrapped therein. In addition, for clarity, not all inorganic particles 171 are labelled in the corresponding figures (e.g., FIG. 1A or 2). Moreover, sizes of the inorganic particles 171 may be enlarged clarity in a corresponding drawing (e.g., FIG. 1A or 2).

In an embodiment, a material of the resin of the polishing layer 170 may include silicone, polyurethane (PU), poly (methyl methacrylate) (PMMA; also known as acrylic), or a stack of the foregoing or a combination thereof.

The aforementioned inorganic particles 171 include spherical or polygonal aluminum oxide particles, spherical or polygonal silicon carbide particles, spherical or polygonal diamond particles, spherical or polygonal quartz particles, spherical or polygonal zirconia ($ZrO_2$) particles, spherical or polygonal ceria ($CeO_2$) particles or a combination thereof. The particle size of the aforementioned inorganic particles is about 0.02 μm~50 μm, and the aforementioned inorganic particles have a Mohs hardness of larger than or equal to 7.

In an embodiment, the particles including in the polishing layer 170 may not include organic particles.

In an embodiment, the polishing layer 170 has a thickness of greater than or equal to 5 μm and less than or equal to 200 μm.

If a polishing layer (e.g., same or similar material as the polishing layer 170, but with a different thickness) has a thickness of less than 5 μm, the cleaning ability of the probe pin cleaning pad (including the polishing layer having a thickness of less than 5 μm) may be reduced. Moreover, or alternatively, if the polishing layer (e.g., same or similar material as the polishing layer 170, but with a different thickness) has a thickness of less than 5 μm, substances (for example, a solder that forms the conductive terminal, or an aluminum material, zinc material, copper material, carbon material or eutectic composition that forms the contact pad) attached to an object (for example, a probe pin 91 in FIG. 4C, FIG. 4F, FIG. 5A to FIG. 5D) may be hard to be separated from each other via the probe pin cleaning pad.

If a polishing layer (e.g., same or similar material as the polishing layer 170, but with a different thickness) has a thickness of greater than 200 μm, scratches, cuts and/or deformations may be caused on an object (for example, the probe pin 91 in FIG. 4C, FIG. 4F, FIG. 5A to FIG. 5D) to be cleaned.

In an embodiment, in the process of cleaning an object (for example, the probe pin 91 in FIG. 4C, FIG. 4F, FIG. 5A to FIG. 5D) by using the probe pin cleaning pad 100, the polishing layer 170 is the first layer in contact with the aforementioned object among the layers of the probe pin cleaning pad 100.

Figure 2:
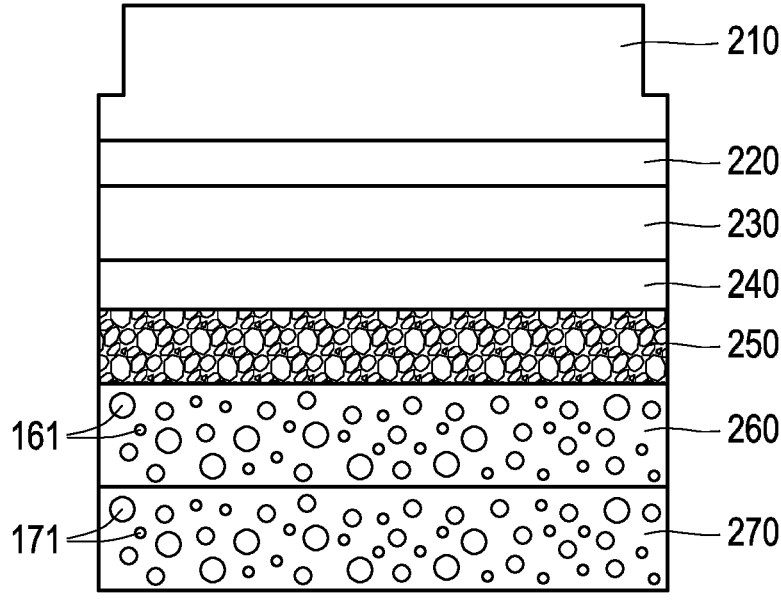
FIG. 2 is a schematic cross-sectional view of a probe pin cleaning pad according to a second embodiment of the disclosure.

FIG. 2 is a schematic cross-sectional view of a probe pin cleaning pad according to a second embodiment of the disclosure.

Referring to FIG. 2, a probe pin cleaning pad 200 may include a composite material layer 210, a first adhesive layer 220, a substrate layer 230, a second adhesive layer 240, a foam layer 250, a cleaning layer 260, and a polishing layer 270. The composite material layer 210 and the substrate layer 230 may be respectively disposed on two opposite sides of the first adhesive layer 220. The substrate layer 230 and the foam layer 250 may be respectively disposed on two opposite sides of the second adhesive layer 240. The cleaning layer 260 may be disposed on the foam layer 250. The polishing layer 270 may be disposed on the cleaning layer 260.

In an embodiment, the foam layer 250, the cleaning layer 260 and the polishing layer 270 are disposed in a stacked manner. That is, the cleaning layer 260 is sandwiched between the foam layer 250 and the polishing layer 270, and/or the foam layer 250 and the polishing layer 270 are in contact with two opposite sides of the cleaning layer 260.

In an embodiment, the composite material layer 210, the first adhesive layer 220, the substrate layer 230, the second adhesive layer 240, the foam layer 250, the cleaning layer 260, and the polishing layer 170 are disposed in a stacked manner.

In an embodiment, the probe pin cleaning pad 200 may serve as a test socket cleaning pad. For example, the probe pin cleaning pad 200 is adapted for a probe pin to embed and penetrate a portion of the layers (e.g., to penetrate the polishing layer 270 and to embed the cleaning layer 260), wherein substances are attached to the probe pin before being cleaned. However, the disclosure is not limited thereto. An application of the probe pin cleaning pad 200 may refer to the subsequent FIGS. 4A-4F and/or FIGS. 5A-5D and the description corresponding thereto.

In an embodiment, the composite material layer 210 may include a rigid plate-shaped body. However, the disclosure is not limited thereto. In an embodiment, a material of the rigid plate-shaped body serving as the composite material layer 210 may include a silicon substrate, a glass fiber board (for example, FR4 board), a rigid plastic substrate (for example, acrylic sheet), a metal plate (for example copper plate), or a composite plate of the foregoing. In an embodiment, the composite plate may have a thickness of 100 μm to 2000 μm. However, the disclosure is not limited thereto. For example, the composite plate substantially has a thickness of 750 μm.

In an embodiment, a material or structure of the first adhesive layer 220 of the probe pin cleaning pad 200 may be the same as or similar to the material or structure of the first adhesive layer 120 of the foregoing embodiments, and both elements have the same or similar uses or properties. Therefore, a detailed description will be omitted.

In an embodiment, a material or structure of the substrate layer 230 of the probe pin cleaning pad 200 may be the same as or similar to the material or structure of the substrate layer 130 of the foregoing embodiments, and both elements have the same or similar uses or properties. Therefore, a detailed description will be omitted.

In an embodiment, a material or structure of the second adhesive layer 240 of the probe pin cleaning pad 200 may be the same as or similar to the material or structure of the second adhesive layer 140 of the foregoing embodiments, and both elements have the same or similar uses or properties. Therefore, a detailed description will be omitted.

In an embodiment, a material or structure of the foam layer 250 of the probe pin cleaning pad 200 may be the same as or similar to the material or structure of the foam layer 150 of the foregoing embodiments, and both elements have the same or similar uses or properties. Therefore, a detailed description will be omitted.

In an embodiment, a material or structure of the cleaning layer 260 of the probe pin cleaning pad 200 may be the same as or similar to the material or structure of the cleaning layer 160 of the foregoing embodiments, and both elements have the same or similar uses or properties. Therefore, a detailed description will be omitted.

In an embodiment, the cleaning layer 260 may substantially have a thickness of 150 μm.

In an embodiment, a material or structure of the polishing layer 270 of the probe pin cleaning pad 200 may be the same as or similar to the material or structure of the polishing layer 170 of the foregoing embodiments, and both elements have the same or similar uses or properties. Therefore, a detailed description will be omitted.

In the disclosure, a probe pin may be cleaned by the probe pin cleaning pad 100 or 200 of any one of the foregoing embodiments. It is worth noting that the disclosure does not limit the use of the probe pin cleaning pad 100 or 200 of any one of the foregoing embodiments.

A cleaning method for a probe pin may include the following steps. In step 1, an electronic component is tested by the probe pin. In step 2, after step 1, the probe pin is cleaned by the probe pin cleaning pad 100 or 200 of any one of the foregoing embodiments.

The cleaning method for a probe pin is exemplified as follows. Referring to FIG. 4A to FIG. 5D, FIG. 4A to FIG. 4F are schematic views of a cleaning method for a probe pin according to an embodiment of the disclosure, and FIG. 5A to FIG. 5D are schematic enlarged partial cross-sectional views of a cleaning method for a probe pin according to an embodiment of the disclosure.

Figure 4A:
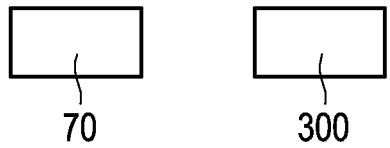
FIG. 4A to FIG. 4F are schematic views of a cleaning method for a probe pin according to an embodiment of the disclosure.
Figure 4B:
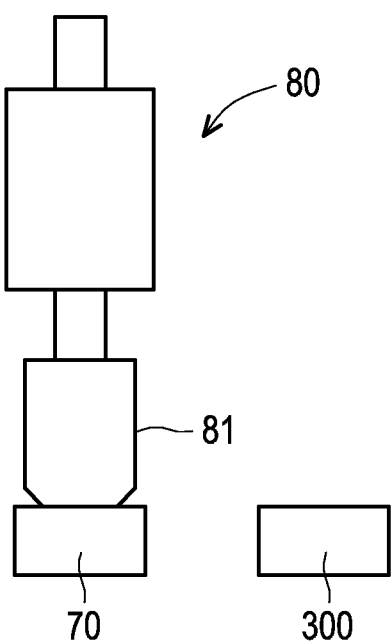
Figure 4C:
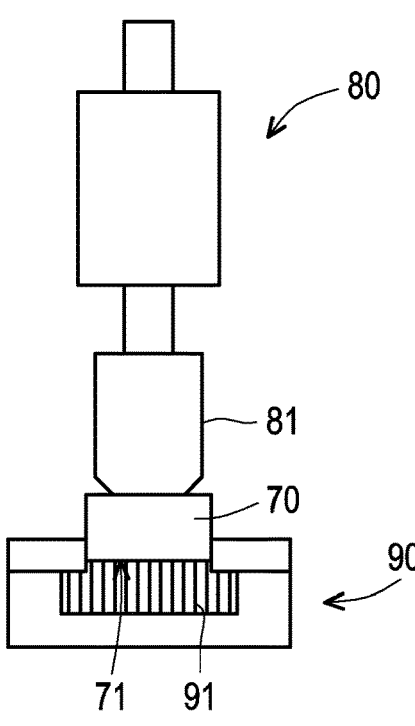

Referring to FIG. 4A to FIG. 4C, an electronic component 70 may be electrically tested by a common test method using the probe pin 91.

As an example, in FIG. 4A, the electronic component 70 and a probe pin cleaning pad 300 are provided.

In an embodiment, the electronic component 70 is, for example, a bare die or a chip package. However, the disclosure is not limited thereto.

In an embodiment, the probe pin cleaning pad 300 may be the same as or similar to the probe pin cleaning pad 100 or the probe pin cleaning pad 200 of the foregoing embodiments. That is, a material or structure of a second adhesive layer 340 of the probe pin cleaning pad 300 may be the same as or similar to the material or structure of the second adhesive layer 140 or 240 of the foregoing embodiments, and both elements have the same or similar uses or properties. Therefore, a detailed description will be omitted. Alternatively, a material or structure of a foam layer 350 of the probe pin cleaning pad 300 may be the same as or similar to the material or structure of the foam layer 150 or 250 of the foregoing embodiments, and both elements have the same or similar uses or properties (for example, density). Therefore, a detailed description will be omitted. Alternatively, a material or structure of a cleaning layer 360 of the probe pin cleaning pad 300 may be the same as or similar to the material or structure of the cleaning layer 160 or 260 of the foregoing embodiments, and both elements have the same or similar uses or properties (for example, Mohs hardness). In addition, the organic particles (e.g., same or similar as the organic particles 161) of the cleaning layer 360 are omitted to be illustrated for clarity. Therefore, a detailed description will be omitted. Alternatively, a material or structure of a polishing layer 370 of the probe pin cleaning pad 300 may be the same as or similar to the material or structure of the polishing layer 170 or 270 of the foregoing embodiments, and both elements have the same or similar uses or properties. In addition, the inorganic particles (e.g., same or similar as the inorganic particles 171) of the polishing layer 370 are omitted to be illustrated for clarity. Therefore, a detailed description will be omitted. In addition, a first adhesive layer (which is, for example, the same as or similar to the first adhesive layer 120 or 220), and a composite material layer (which is, for example, the same as or similar to the composite material layer 210) of the probe pin cleaning pad 300 are omitted from illustration in the drawings.

Then, as shown in FIG. 4B, the electronic component 70 to be tested may be picked up by a pick-up head 81 of a pick-up-and-place apparatus 80.

Then, as shown in FIG. 4C, by the pick-up-and-place apparatus 80, the electronic component 70 to be tested may be placed on a test apparatus 90.

The test apparatus 90 has, for example, a plurality of probe pins 91. The probe pin 91 may contact a conductive terminal (for example, solder ball) (not shown) or a contact pad (not shown) on a tested surface 71 of the electronic component 70, so as to test the electronic component 70. For example, force or pressure may be applied to the electronic component 70 to be tested and/or the probe pin 91, so that the conductive terminal or contact pad on the tested surface 71 of the electronic component 70 to be tested and the probe pin 91 contact each other.

During the contact between the electronic component 70 and the probe pin 91, some substances (for example, a solder that forms the conductive terminal, or an aluminum material, zinc material, copper material, carbon material or eutectic composition that forms the contact pad) may be attached to the probe pin 91.

In an embodiment, the test method is, for example, final test (FT). However, the disclosure is not limited thereto. In an embodiment, the test method may be chip probing (CP).

After the exemplary test shown in FIG. 4A to FIG. 4C, the probe pin 91 may be cleaned by the probe pin cleaning pad 300 in a similar operation manner.

Figure 4D:
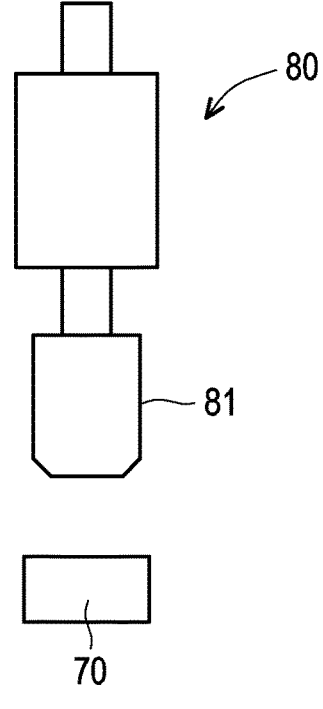

Taking FIG. 4C to FIG. 4D as an example, after the electronic component 70 is tested, the electronic component 70 and the probe pin 91 may be separated from each other, and the electronic component 70 may be placed by the pick-up-and-place apparatus 80.

In an embodiment, during the separation of the electronic component 70 and the probe pin 91, some substances (for example, a solder that forms the conductive terminal, or an aluminum material, zinc material, copper material, carbon material or eutectic composition that forms the contact pad) may peel off and be attached to the probe pin 91.

Figure 4E:
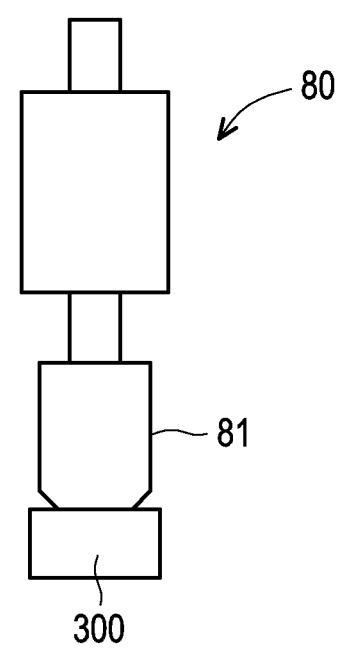

Then, as shown in FIG. 4E, the probe pin cleaning pad 300 may be picked up by the pick-up head 81 of the pick-up-and-place apparatus 80.

Figure 4F:
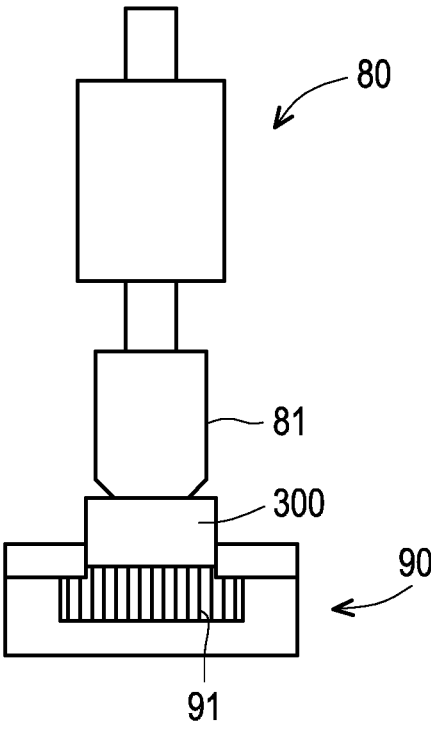

Then, as shown in FIG. 4F, by the pick-up-and-place apparatus 80, the probe pin cleaning pad 300 may be placed on the test apparatus 90, so that the probe pin 91 can be cleaned by the probe pin cleaning pad 300.

For example, force or pressure may be applied to the probe pin cleaning pad 300 and/or the probe pin 91, so that the probe pin cleaning pad 300 and the probe pin 91 contact each other, causing a substance 99 (which is, for example, a solder, an aluminum material, a zinc material, a copper material, a carbon material or eutectic composition; marked or shown in FIG. 5A to FIG. 5D) attached to the probe pin 91 to adhere to the cleaning layer 360 of the probe pin cleaning pad 300. After that, the probe pin cleaning pad 300 and the probe pin 91 may be separated from each other, and the substance 99 attached to the probe pin 91 may be reduced by the probe pin cleaning pad 300.

For details, please refer to FIG. 5A to FIG. 5D.

Figure 5A:
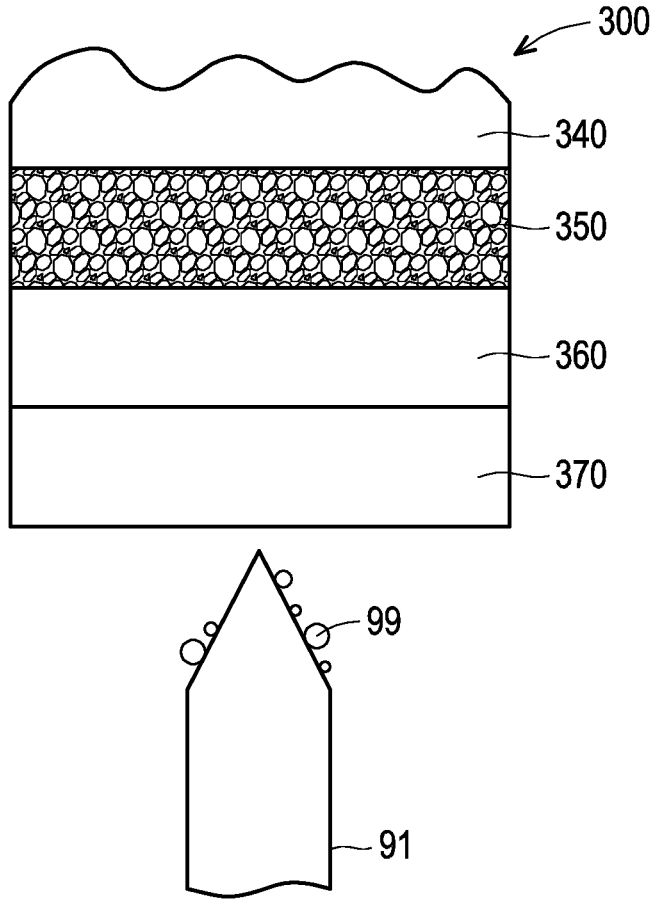
FIG. 5A to FIG. 5D are schematic enlarged partial cross-sectional views of a cleaning method for a probe pin according to an embodiment of the disclosure.
Figure 5B:
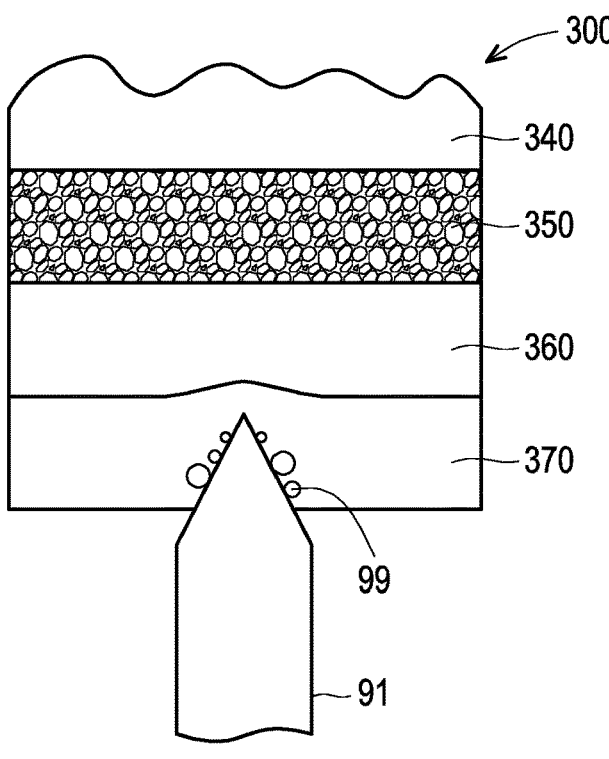

As shown in FIG. 5A to FIG. 5B, one end (that is, one end for contacting the electronic component 70) of the probe pin 91 for testing pierces may penetrate into the polishing layer 370 of the probe pin cleaning pad 300. The substance 99 attached to the probe pin 91 may be loosened from the probe pin 91 by the inorganic particles in the polishing layer 370. For example, the substance 99 attached to the probe pin 91 may be rubbed against the inorganic particles in the polish- ing layer 370 during the process of the probe pin 91 penetrating into the polishing layer 370.

Figure 5C:
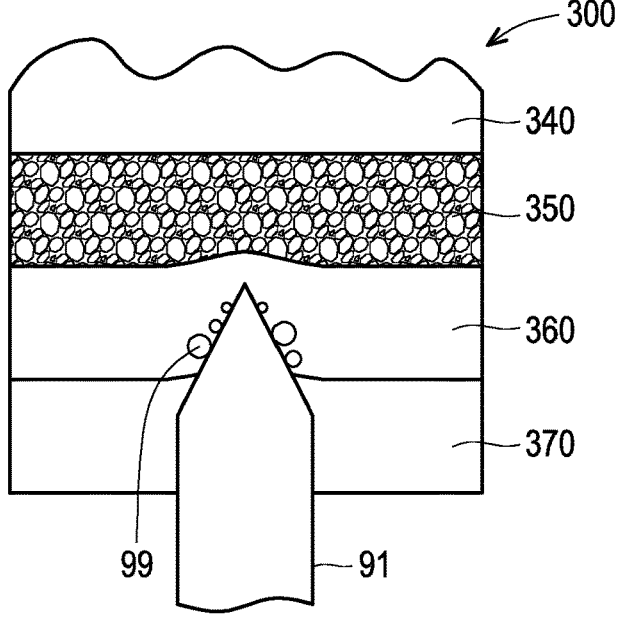

As shown in FIG. 5B to FIG. 5C, the aforementioned end of the probe pin 91 may further penetrate into the cleaning layer 360 of the probe pin cleaning pad 300 during the process of the probe pin 91 penetrating into the polishing layer 370.

As shown in FIG. 5C, since during the process of the probe pin 91 penetrating into the polishing layer 370, the substance 99 attached to the probe pin 91 may have be loosened from the probe pin 91, so the organic particles of the cleaning layer 360 may be used for removing the substance 99 from the probe pin 91 more easily when the probe pin 91 penetrating into the cleaning layer 360. During the process of the probe pin 91 penetrating into the polishing layer 370 or further embedding the cleaning layer 360, the foam layer 350 may serve as a corresponding buffer or compression area to reduce the damage possibility of the probe pin 91.

Figure 5D:
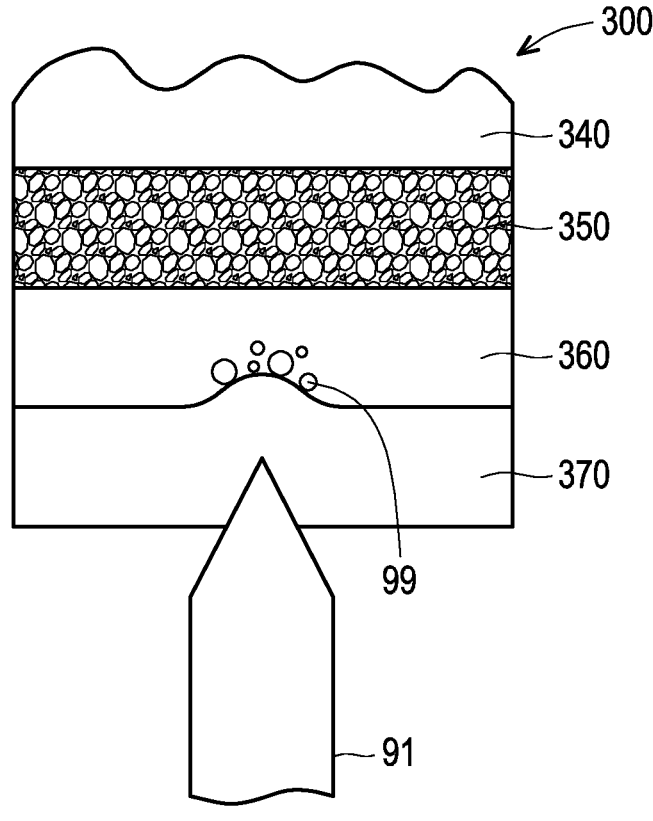

As shown in FIG. 5C to 5D, during the process of the probe pin 91 separating from the polishing layer 370, most of the substance 99 being removed from the probe pin 91 may be captured and/or trapped in the cross-linked network structure of the silicon resin of the cleaning layer 360. Moreover, since the Young's modulus of the cleaning layer 360 is small than the Young's modulus of the polishing layer 370, most of the substance 99 being removed from the probe pin 91 will be captured and/or trapped by the cleaning layer 360 during the aforementioned separation process. As such, the possibility of substance 99 re-attaching and re-adhering to probe pin 91 may be reduced during the aforementioned separation process. For the avoidance of doubt, it is noted that the reported Young's modulus of a layer is determined the whole layer (e.g., the whole cleaning layer 360 may include the silicone resin having a cross-linked network structure and the organic particles, and/or the whole polish- ing layer 370 may include the silicone resin having a cross-linked network structure and the inorganic particles) by a standardized test (e.g., ASTM D882) and corresponding calculations.

As shown in FIG. 5D, after the probe pin cleaning pad 300 and the probe pin 91 are separated from each other, the amount of the substance 99 attached to and/or coated on the probe pin 91 may be reduced. For example, during the probe pin 91 separating being sequentially extracted from the cleaning layer 360 and the polishing layer 370, the substance 99 are removed from the probe pin 91 and are captured and/or trapped by the cleaning layer 360 (e.g., be captured and/or trapped in the cross-linked network structure of the silicon resin of the cleaning layer 360).

In the method or step for cleaning the probe pin 91 by the probe pin cleaning pad 100, 200 or 300 of any one of the foregoing embodiments of the disclosure, the probe pin 91 may not be disassembled or separated from the test appa- ratus 90. Moreover, the cleaning of the probe pin 91 may be performed under the same or similar recipe for testing the electronic component 70. That is, the steps of the method for cleaning the probe pin 91 may be performed in-situ or on-line.

It is worth noting that, FIG. 4A to FIG. 5D only exem- plarily describe one method for cleaning the probe pin 91, and the type of the probe pin 91 is not limited in the disclosure. For example, in FIG. 4A to FIG. 5D, the probe pin 91 as shown is a vertical probe pin. However, the disclosure is not limited thereto. In an embodiment (not shown), the probe pin cleaning pad 100, 200 or 300 of any one of the foregoing embodiments of the disclosure may be employed for cleaning of a cantilever probe pin by a similar common test method.

In summary, in the probe pin cleaning pad and the cleaning method for a probe pin by using the probe pin cleaning pad according to the disclosure, since the cleaning layer is adapted to adhere to a substance on the probe pin, the probe pin cleaning pad and the cleaning method for a probe pin are suitable for cleaning of probe pins and may reduce scratches on the probe pins.

What is claimed is:

1. A probe pin cleaning pad, comprising:

a first adhesive layer;

a substrate layer, disposed on the first adhesive layer;

a second adhesive layer;

a foam layer, wherein the second adhesive layer is dis- posed between the substrate layer and the foam layer;

a cleaning layer, wherein a material of the cleaning layer comprises:

silicone resin, having a cross-linked network structure; and organic particles, having a Mohs hardness of less than 7; and a polishing layer, wherein the cleaning layer is disposed between the foam layer and the polishing layer, wherein a material of the polishing layer comprises:

resin; and inorganic particles, having a Mohs hardness of large than or equal to 7, wherein:

the foam layer has a closed-cell structure;

the density of the foam layer is 0.1 g/cm$^3$ to 0.6 g/cm$^3$;

the foam layer is disposed between the second adhesive layer and the cleaning layer;

a portion of the cleaning layer is embedded in the foam layer;

a portion of the second adhesive layer is embedded in the foam layer; and the probe pin cleaning pad is adapted for a probe pin with a plurality of substances attached thereto to penetrate through the polishing layer and to further penetrate into the cleaning layer for cleaning, and during the probe pin being sequentially extracted from the cleaning layer and the polishing layer, the plurality of substances is removed from the probe pin and are captured and/or trapped in the cross-linked network structure of the silicon resin of the cleaning layer.

2. The probe pin cleaning pad according to claim 1, wherein the cleaning layer is sandwiched between the foam layer and the polishing layer, and/or the foam layer and the polishing layer are in contact with two opposite sides of the cleaning layer.

3. The probe pin cleaning pad according to claim 1, wherein a thickness of the foam layer is greater than or equal to 200 μm and less than or equal to 1 mm.

4. The probe pin cleaning pad according to claim 1, wherein the organic particles are not catalysts during a reaction for forming the silicone resin.

5. The probe pin cleaning pad according to claim 1, wherein a Young's modulus of the polishing layer is larger than a Young's modulus of the cleaning layer.

6. The probe pin cleaning pad according to claim 1, further comprising:

a release layer or composite material layer, where the first adhesive layer is disposed on the release layer or composite material layer.

7. A cleaning method for a probe pin, comprising:

step 1: testing an electronic component by the probe pin; and step 2: after step 1, cleaning the probe pin by the probe pin cleaning pad according to claim 1.

8. The cleaning method for a probe pin according to claim 7, wherein step 1 and step 2 are performed in-situ or on-line.

\* \* \* \* \*